(12) United States Patent
Iwata et al.

(10) Patent No.: US 11,588,475 B2
(45) Date of Patent: Feb. 21, 2023

(54) CONTROL METHOD AND SEMICONDUCTOR INTEGRATED CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Haruya Iwata, Kanagawa (JP); Tatsuya Tokue, Kanagawa (JP); Sohei Kushida, Tokyo (JP); Takayuki Mori, Chiba (JP); Satoshi Kamiya, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/499,906

(22) Filed: Oct. 13, 2021

(65) Prior Publication Data

US 2022/0029612 A1 Jan. 27, 2022

Related U.S. Application Data

(63) Continuation of application No. 16/989,972, filed on Aug. 11, 2020, now Pat. No. 11,177,798.

(30) Foreign Application Priority Data

Sep. 19, 2019 (JP) .............................. JP2019-170590

(51) Int. Cl.
  *H03K 5/00* (2006.01)
  *G06F 1/08* (2006.01)
(52) U.S. Cl.
  CPC ........... *H03K 5/00006* (2013.01); *G06F 1/08* (2013.01)

(58) Field of Classification Search
None
See application file for complete search history.

(56) References Cited

U.S. PATENT DOCUMENTS 5,675,282 A * 10/1997 Saito ..................... G06F 1/3237
  714/E11.003
7,222,244 B2 * 5/2007 Kawahara .......... H03K 19/1735
  713/320

(Continued)

FOREIGN PATENT DOCUMENTS

JP 2008141013 A 6/2008
JP 2016506576 A 3/2016

(Continued)

OTHER PUBLICATIONS

Notice of Allowance dated Jul. 14, 2021 issued in U.S. Appl. No. 16/989,972.

(Continued)

*Primary Examiner* — Thomas J. Hiltunen
(74) *Attorney, Agent, or Firm* — Holtz, Holtz & Volek PC

(57) ABSTRACT

A semiconductor integrated circuit includes a clock controller generating a clock; and a plurality of blocks that operate by using the clock. The clock controller performs statistical processing for the plurality of blocks, controls a frequency of the clock to a first frequency, changes the frequency of the clock from the first frequency to a second frequency, generates the clock of the second frequency after a time predicted by the statistical processing as a time for which the second frequency is to be continued elapses from a timing when the frequency of the clock is changed, and supplies the generated clock to the blocks. The clock controller generates a third frequency clock obtained by decimating down the second frequency from the first frequency according to a time for which the first and second frequencies are to be continued after the frequency of the clock is changed from (Continued)

the second frequency to the first frequency, and supplies the generated clock to the blocks.

4 Claims, 13 Drawing Sheets

(56) References Cited

U.S. PATENT DOCUMENTS

| | | | |
|---|---|---|---|
| 8,370,663 | B2 | 2/2013 | Frid et al. |
| 8,631,262 | B2 | 1/2014 | Park |
| 8,650,423 | B2 | 2/2014 | Li et al. |
| 9,698,796 | B2 | 7/2017 | Sekiguchi |
| 10,579,093 | B2 | 3/2020 | Seenappa et al. |
| 10,712,767 | B2 | 7/2020 | Kamiya |
| 10,775,831 | B1 | 9/2020 | Kamiya et al. |
| 11,177,798 | B2 * | 11/2021 | Iwata ..................... G06F 1/08 |
| 2008/0129341 | A1 | 6/2008 | Mochizuki |
| 2014/0181553 | A1 | 6/2014 | Eckert et al. |
| 2019/0086949 | A1 | 3/2019 | Kamiya |

FOREIGN PATENT DOCUMENTS

| | | |
|---|---|---|
| JP | 2017021539 A | 1/2017 |
| JP | 2017027204 A | 2/2017 |
| JP | 2019057281 A | 4/2019 |

OTHER PUBLICATIONS

Office Action (Non-Final Rejection) dated Mar. 18, 2021 issued in U.S. Appl. No. 16/989,972.

* cited by examiner

| LEVEL | 1/ (CLOCK FREQUENCY DIVISION RATIO) |
|---|---|
| 0 | 1/1 |
| 1 | 1/2 |
| 2 | 1/3 |
| 3 | 1/4 |
| 4 | 1/5 |
| 5 | 1/6 |
| 6 | 1/7 |
| 7 | 1/8 |
| 8 | 1/9 |

| LEVEL | 1/ (CLOCK FREQUENCY DIVISION RATIO) |
|---|---|
| 0 | 1/16 |
| 1 | 1/18 |
| 2 | 1/20 |
| 3 | 1/22 |
| 4 | 1/24 |
| 5 | 1/26 |
| 6 | 1/28 |
| 7 | 1/30 |
| 8 | 1/32 |

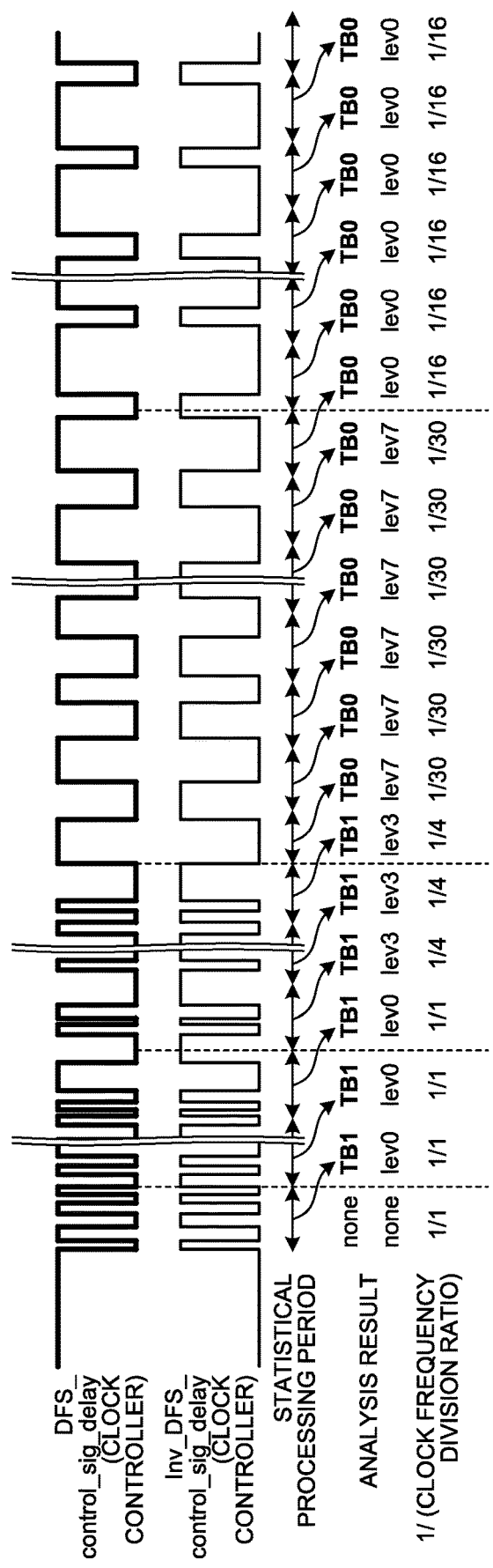

CONTROL METHOD AND SEMICONDUCTOR INTEGRATED CIRCUIT

CROSS-REFERENCE TO RELATED APPLICATIONS

This application is a Continuation Application of U.S. application Ser. No. 16/989,972, filed Aug. 11, 2020, which is based upon and claims the benefit of priority from Japanese Patent Application No. 2019-170590, filed on Sep. 19, 2019; the entire contents of all of which are incorporated herein by reference.

FIELD

Embodiments described herein relate generally to a control method and a semiconductor integrated circuit.

BACKGROUND

In a semiconductor integrated circuit that operates by using a clock, a frequency of the clock may be dynamically controlled. At this time, it is desirable that the frequency of the clock is appropriately controlled.

BRIEF DESCRIPTION OF THE DRAWINGS

FIGS. 7A and 7B are diagrams illustrating examples of a data structure of a frequency division ratio decision information according to the second embodiment;

FIG. 9 is a timing chart illustrating the control method according to the second embodiment;

DETAILED DESCRIPTION

In general, according to one embodiment, there is provided a control method. The method includes controlling a frequency of a clock to a first frequency. The method includes changing the frequency of the clock from the first frequency to a second frequency lower than the first frequency. The method includes statically predicting a time for which the second frequency is to be continued. The method includes changing the frequency of the clock from the second frequency to the first frequency after the time for which the second frequency is to be continued elapses from a timing when the frequency of the clock is changed to the second frequency.

Exemplary embodiments of a control method will be explained below in detail with reference to the accompanying drawings. The present invention is not limited to the following embodiments.

First Embodiment

A control method according to the first embodiment is executed by a semiconductor integrated circuit that operates by using a clock. In this semiconductor integrated circuit, a frequency of the clock may be dynamically controlled. This control is called dynamic frequency scaling (DFS) control. In the DFS control, it is desirable that the frequency of the clock is appropriately controlled. A system that executes this control method includes a circuit that supplies a clock, and can be applied to a semiconductor integrated circuit such as a microprocessor for low power consumption.

Figure 1:
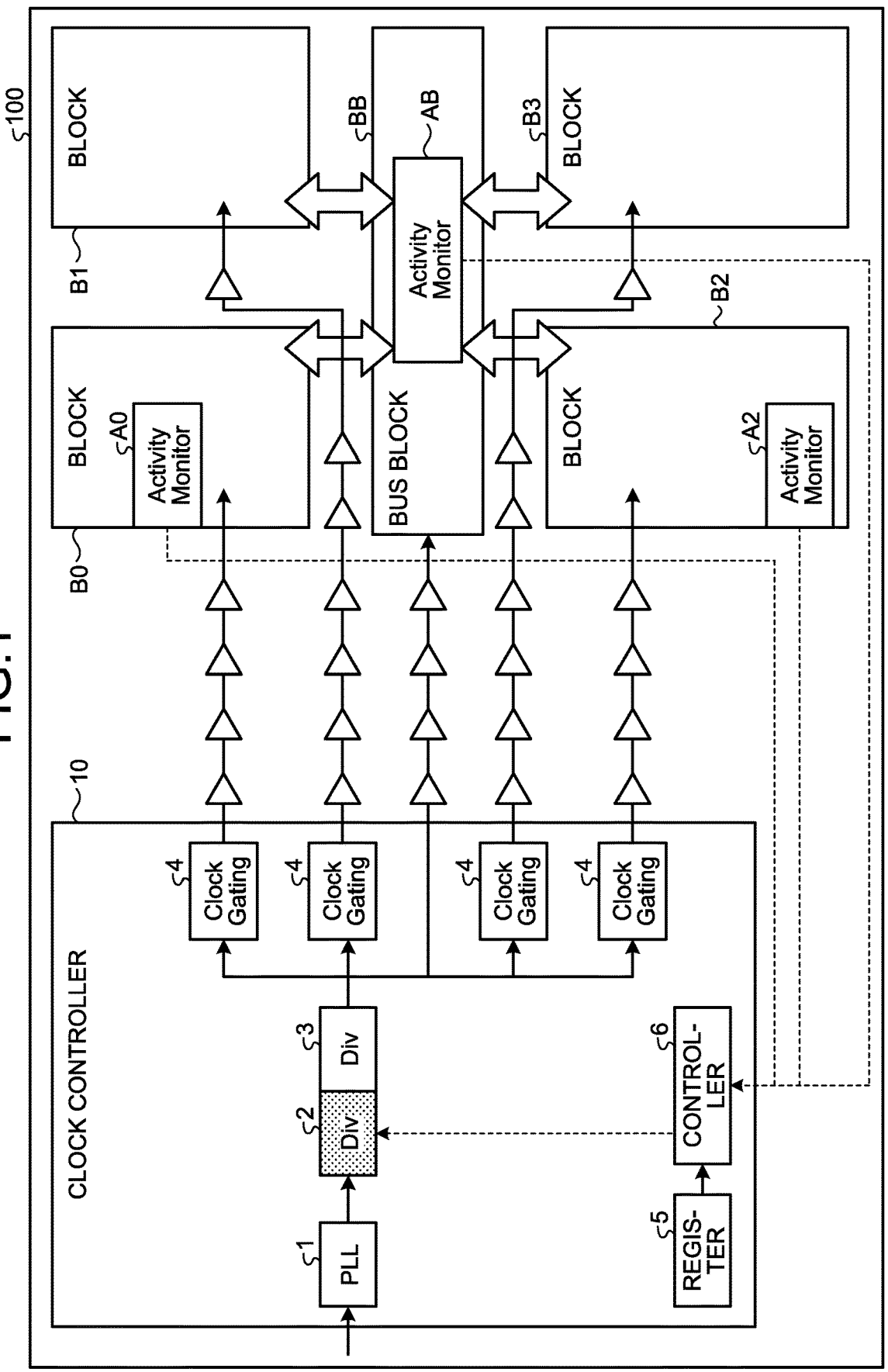
FIG. 1 is a configuration diagram of a semiconductor integrated circuit that executes a control method according to a first embodiment.

FIG. 1 is a configuration diagram of the semiconductor integrated circuit 100 that executes a control method according to the first embodiment. The semiconductor integrated circuit 100 includes a clock controller 10, a bus block BB, and a plurality of blocks B0, B1, B2, and B3.

The clock controller 10 functions as a clock generation circuit that generates a clock to be supplied to each portion of the semiconductor integrated circuit 100. Each of the blocks B0 to B3 is a functional block that operates by using the clock supplied from the clock controller 10. The bus block BB includes a bus that operates by using the clock supplied from the clock controller 10.

An activity monitor (state monitoring circuit) that detects any state of a certain object is provided in the semiconductor integrated circuit 100 as necessary. For example, the activity monitor may be provided in the bus block BB, or may be provided in all or a part of the blocks. In FIG. 1, activity monitors AB, A0, and A2 are provided in the bus block BB and the blocks B0 and B2.

For example, the activity monitor AB may be configured to monitor whether or not each bus access (transaction) of the blocks B0 to B3 to the bus block BB occurs.

For example, the activity monitors A0 and A2 may be configured to monitor a free capacity of a storage unit such as a FIFO that sends data to a predetermined device, may be configured to monitor a temperature of a predetermined location, or may be configured to monitor state transitions between a plurality of operation modes having different power consumption.

The clock controller 10 includes a PLL circuit 1, frequency dividers 2 and 3, a plurality of clock gating circuits 4, a register 5, and a controller 6. Here, the components of the clock controller 10 are not limited thereto. The frequency divider 3 can divide the clock of which the frequency is divided by the frequency divider 2 to frequencies appropriate for the operations of the blocks B0 to B3. The plurality of clock gating circuits 4 corresponds to the plurality of blocks B0 to B3. Each clock gating circuit 4 transfers the clock from the frequency dividers 2 and 3 to the corresponding block. The clock controller 10 can restrict the blocks to which a clock signal is supplied by stopping a part of the plurality of clock gating circuits 4. For example, the clock controller 10 may restrict the blocks while switching between the blocks to which the clock signal is supplied by a round robin manner (e.g., at predetermined time intervals in a time-division method).

The configuration may be appropriately changed by omitting a part of the components, for example, the installation of the frequency divider 3. For example, the clock controller 10 may have a configuration in which the PLL circuit 1 is omitted as long as the clock controller has a clock source such as an external input clock or an oscillator. Alternatively, for example, when the frequency divider 2 alone can divide the frequency of the clock into frequencies appropriate for the operations of the blocks B0 to B3, the clock controller 10 has a configuration in which the frequency divider 3 is omitted. When the blocks to which the clock signal is supplied are not limited, the clock controller 10 may have a configuration in which the plurality of clock gating circuits 4 is omitted.

The PLL circuit 1 outputs a clock signal of which a phase is adjusted to the frequency divider 2. The frequency dividers 2 and 3 output a clock signal obtained by lowering a frequency of the clock signal (source clock). The clock gating circuit 4 performs clock gating on the clock signal supplied from the frequency divider 3, and outputs the clock signal.

The frequency divider 2 is a pulse mask type, and has a function of generating a frequency-divided clock having a frequency lower than that of the source clock by masking a part of a pulse train of the source clock. Specifically, the frequency divider 2 has a function of generating the frequency-divided clock lower than that of the source clock by using a pattern (hereinafter, referred to as a "clock pulse pattern") of a bit string that masks a part of the pulse train of the source clock. The clock pulse pattern defines a timing when the pulse train of the source clock is masked and a timing when the clock is output.

The frequency divider 2 has a function of switching the clock pulse pattern and switching the frequency of the frequency-divided clock under the control of predetermined hardware (for example, controller 6). More specifically, the frequency divider 2 has a function of generating frequency-divided clocks having different frequencies by selectively using one of a plurality of clock pulse patterns prepared in advance. The frequency of the frequency-divided clock includes a low frequency (second frequency) and a high frequency (first frequency).

The register 5 stores various pieces of information to be used by the controller 6 to control the frequency divider 2. The controller 6 controls the frequency divider 2 with a control signal. For example, the controller 6 can change the frequency of the frequency-divided clock generated by the frequency divider 2 according to a state of a predetermined object obtained from the activity monitor provided in the semiconductor device 100. The frequency-divided clock output from the frequency divider 2 is supplied to each block via the frequency divider 3 and the clock gating circuit 4.

The semiconductor integrated circuit 100 that performs the DFS control has an architecture (DFS control architecture) that notifies the clock controller 10 of the state of the block from each of the blocks B0 to B3 by using a DFS control signal after a DFS control mechanism is enabled. In the DFS control architecture, the clock controller 10 determines the state of each of the blocks B0 to B3 by using the DFS control signal, and performs control such that the frequency of the frequency-divided clock to be supplied to the block in a non-busy state is set to the low frequency. The frequency at this time is constant at a division ratio set before the DFS control mechanism is enabled. When this block is returned to a busy state, the corresponding frequency-divided clock is returned to the high frequency.

A physical delay and a system delay are caused in the DFS control signal until the DFS control signal reaches the clock controller 10 from each of the blocks B0 to B3, and BB. For example, a wiring delay or an element delay due to a buffer. Operation clocks of the clock controller 10 and each of the blocks B0 to B3 may not necessarily have the same frequency and the same phase, but may have an asynchronous relationship. In this case, after the DFS control signal reaches the clock controller 10, a delay is caused in synchronization and determination processing.

For example, a frequency-divider enable signal deviates from the DFS control signal by a delay amount from a relationship between the busy state of each of the blocks B0 to B3, the DFS control signal, and the enabling of the frequency divider. Thus, there is a period in which the blocks B0 to B3 operate by using the low-frequency clock is present in a busy period. In the semiconductor integrated circuit 100, a processing time is delayed due to a low-speed operation in the busy period, and thus, performance may deteriorate.

Therefore, in the present embodiment, in the semiconductor integrated circuit 100, when the frequency of the clock is changed from the high frequency to the low frequency, a time for which the low frequency is to be continued is statistically predicted. The present embodiment aims to suppress the performance deterioration by returning the frequency-divided clock to the high frequency after the predicted time elapses.

Specifically, the semiconductor integrated circuit 100 speculatively returns the frequency-divided clock from the low frequency in order to cancel an overhead. For example, when each of the blocks B0 to B3 is in the non-busy state, the semiconductor integrated circuit 100 changes the clock from the high frequency to the low frequency, predicts an end timing of the current DFS enable period (non-busy period) from the past non-busy period by statistical processing, and returns the clock to the original high frequency before any time (corresponding to the delay time). That is, the performance degradation due to the delay of the DFS control signal can be suppressed by speculatively returning the clock before the delay time. The semiconductor integrated circuit 100 can reduce power consumption and maintain performance by adaptively dividing the clock according to a distribution state of the busy period and the non-busy period. When the predicted time deviates so as to be later than an actual end timing of the non-busy state, the clock is returned at the actual end timing such that the performance does not deteriorate.

It should be noted that, in the semiconductor integrated circuit 100, a timing when the prediction of the DFS enable period (non-busy period) by the statistical processing is started may be any timing, and may be a timing when an initial setting at the time of starting the semiconductor integrated circuit 100 is completed or may be a timing when a command instructing the start of the prediction from a host (for example, a computer connected to the semiconductor integrated circuit 100) is received and the command processing is performed.

Figure 2:
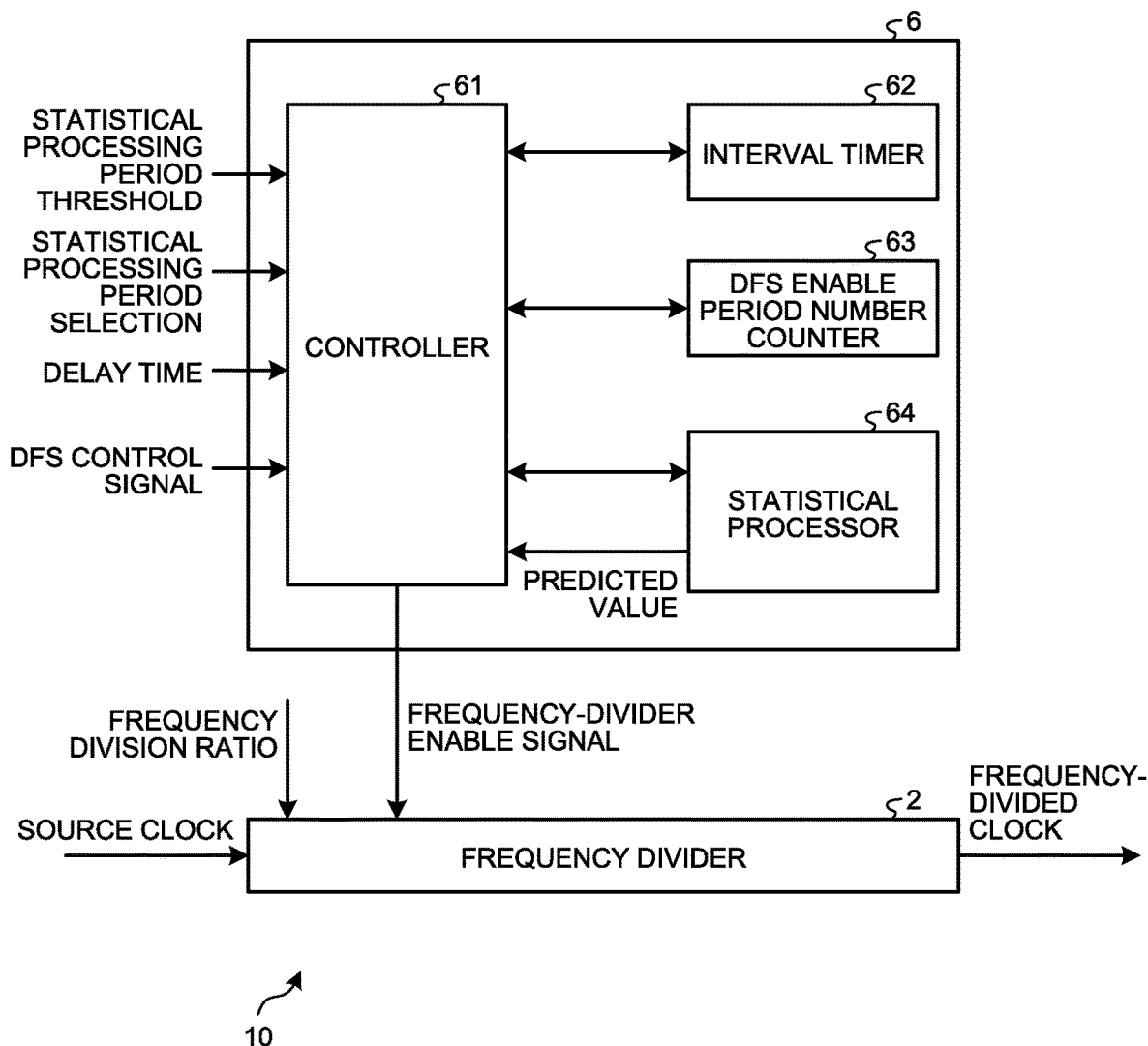
FIG. 2 is a configuration diagram of a clock controller according to the first embodiment.

FIG. 2 is a configuration diagram of the controller 6. The controller 6 includes a controller 61, an interval timer 62, a DFS enable period number counter 63, and a statistical processor 64.

The controller 61 collectively controls each part of the controller 6. The statistical processor 64 calculates a predicted value of the non-busy period by performing the statistical processing, and supplies the calculated predicted value to the controller 61. For example, the statistical processor 64 counts an appearance frequency of the non-busy period for each of a plurality of temporal intervals, and generates a histogram indicating the collected result. The statistical processor 64 may use, as the predicted value, the most frequently appearing value of the histogram, an average value of the histogram, or a median value of the histogram. Alternatively, the statistical processor 64 may use, as the predicted value, a value predicted by using a prediction model (learned model) generated by performing machine learning for a length of the non-busy period. Hereinafter, a case where the most frequently appearing value of the histogram is used as the predicted value is illustrated.

The interval timer 62 manages a statistical processing period. The statistical processing period is a unit period in which the statistical processing is performed. The interval timer 62 notifies the controller 61 at a timing when the statistical processing period is completed is reached. In response to this operation, the statistical processor 64 adds the result of the statistical processing for the completed statistical processing period, and updates the statistical processing of the histogram. The counter 63 counts the number of DFS enable periods, and supplies the counted value to the controller 61.

The controller 61 receives a statistical processing period threshold, a statistical processing period selection signal, and a delay time from the register 5, receives the DFS control signal from each of the blocks B0 to B3, and receives the predicted value of the non-busy period from the statistical processor 64. In response to these operations, the controller 61 generates a frequency-divider enable signal, and supplies the generated frequency-divider enable signal to the frequency divider 2. Accordingly, the controller 6 controls frequency division processing using the frequency divider 2.

The controller 61 causes the statistical processor 64 to perform the statistical processing in the selected period. The statistical processor 64 outputs the predicted value of the non-busy period after the processing. The controller 61 monitors the DFS control signal, asserts the frequency-divider enable signal when the DFS control signal is in the non-busy state, and deasserts the predicted value before the delay time. When the DFS control signal is in the busy state before the delayed DFS control signal, the busy state of the DFS control signal is preferentially applied, and the frequency-divider enable signal is deasserted.

The frequency divider 2 receives the source clock from the PLL circuit 1, receives a frequency division ratio $R_0$ from the clock controller 10, and receives the frequency-divider enable signal from the controller 61. The frequency divider 2 frequency-divides the source clock according to the frequency division ratio $R_0$ and the frequency-divider enable signal, and generates the frequency-divided clock. For example, the frequency divider 2 frequency-divides the source clock by the frequency division ratio $R_0$ and transfers the divided clocks to the frequency divider 3 in a period in which the frequency divider enable signal is at an active level. In response to this operation, the clock controller 10 controls the frequency of the clock to the low frequency. The frequency divider 2 transfers the source clock to the frequency divider 3 without frequency-dividing the source clock in a period in which the frequency-divider enable signal is at a non-active level. In response to this operation, the clock controller 10 controls the frequency of the clock to the high frequency.

Figure 3:
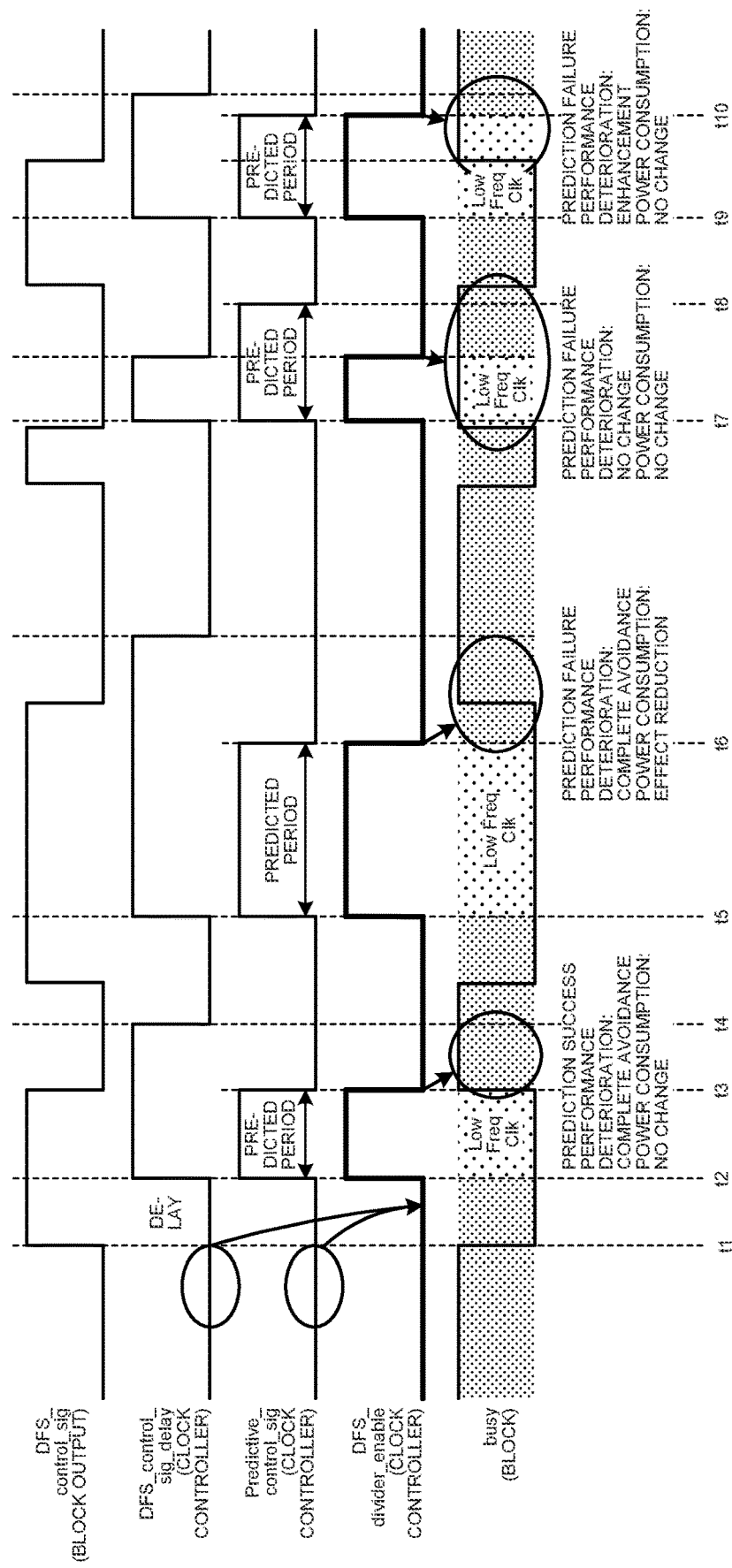
FIG. 3 is a timing chart illustrating the control method according to the first embodiment.
Figure 4:
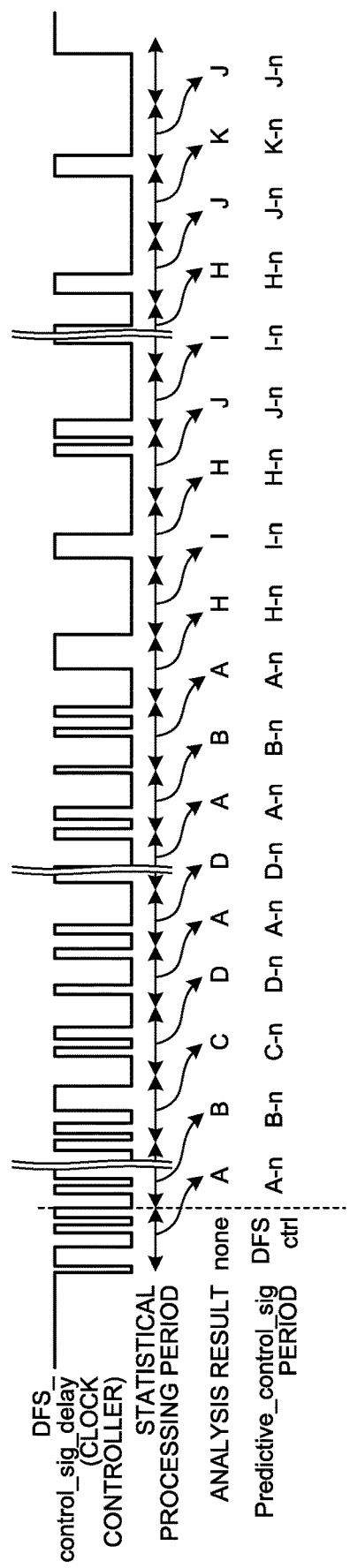
FIG. 4 is a timing chart illustrating the control method according to the first embodiment.

Next, the control method executed by the semiconductor integrated circuit 100 will be described with reference to FIGS. 3 and 4. FIGS. 3 and 4 are timing charts illustrating the control method.

In FIG. 3, DFS_control_sig is the DFS control signal output from each of the blocks B0 to B3, and DFS_control_sig_delay is the DFS control signal received by the clock controller 10. DFS_control_sig_delay has a physical delay and a system delay for DFS_control_sig (hereinafter, referred to as a delayed DFS control signal). Predictive_control_sig is the DFS control signal generated based on the prediction of the non-busy period in the clock controller 10 (hereinafter, referred to as a predicted DFS control signal). DFS_divider_enable is the frequency-divider enable signal generated by performing an AND operation on the delayed DFS control signal and the predicted DFS control signal in the clock controller 10. 'busy' is a busy signal indicating the busy state of the block to be controlled.

At the block to be controlled, the DFS control signal rises at timing t1 when the DFS control signal is changed from the busy state to the non-busy state, but the delayed DFS control signal rises at timing t2 delayed from timing t1. In FIG. 3, dense hatched regions in which the frequency of the clock is the high frequency and coarse hatched regions (Low Freq Clk) in which the frequency of the clock is the low frequency are depicted so as to be superimposed on the busy signal.

The clock controller 10 raises the predicted DFS control signal in synchronization with the rise of the delayed DFS control signal, and lowers the predicted DFS control signal after a width of the predicted time elapses. The clock controller 10 changes the clock from the high frequency to the low frequency in synchronization with timing t2 when the predicted DFS control signal rises, and changes the clock from the low frequency to the high frequency in synchronization with timing t3 when the predicted DFS control signal falls. At this timing t3, the block to be controlled is changed from the non-busy state to the busy state. The delayed DFS control signal falls at timing t4 after timing t3.

It is assumed that the clock is changed from the low frequency to the high frequency at a rising edge of the delayed DFS control signal and the clock is changed from the high frequency to the low frequency at a falling edge. In this case, at timings t3 and t4, the block is in the busy state, whereas the clock is maintained at the low frequency, and thus, the performance may deteriorate.

In contrast, in FIG. 3, since the clock controller 10 succeeds in predicting the non-busy period (timings t2 and t3), the clock can be returned from the low frequency to the high frequency at timing t3 when the busy period of the block to be controlled is started, and thus, the performance deterioration can be avoided. That is, it is possible to maintain the performance and reduce the power consumption.

It should be noted that the clock controller 10 may fail to predict the non-busy period. For example, in the prediction at timing t5 and t6, since the predicted period is shorter than the actual non-busy period, the clock is returned from the low frequency to the high frequency before the block to be controlled is changed from the non-busy state to the busy state, but the performance deterioration may be avoided. In the prediction of timings t7 and t8, the predicted period is longer than the actual non-busy period, but since the delayed DFS control signal falls earlier, the frequency-divider enable signal falls at this timing. Accordingly, there may be no influence. In the prediction of timings t9 and t10, the predicted period is longer than the actual non-busy period, but since the delayed DFS control signal falls earlier, an improvement effect may be observed.

That is, in a case where the prediction fails, the performance is improved in a case where the predicted period is shorter than the actual period. However, an effect of reducing the power consumption is likely to be diminished depending on a degree of deviation. In a case where the predicted period is longer than the actual period, the effect of reducing the performance deterioration and the power consumption is obtained as in the case of the control using the delayed DFS control signal.

The delayed DFS control signal and the predicted DFS control signal illustrated in FIG. 3 are depicted in a longer time span in FIG. 4. In the first statistical processing period, the predicted DFS control signal is in an asserted state. An assertion period of the frequency-divider enable signal is the same as an assertion period of the delayed DFS control signal. That is, the first statistical processing period is the same as the assertion period of the delayed DFS control signal.

In the next statistical processing period, the predicted value is 'A', and the predicted DFS control signal is asserted in period 'A-n' obtained by subtracting the set delay time (fixed time) n from the assertion period of the delayed DFS control signal. Similarly, for each statistical processing period, the predicted value is 'B' to 'J', and the predicted DFS control signal is asserted in period from 'B-n' to 'J-n' obtained by subtracting the set delay time (fixed time) n from the assertion period of the delayed DFS control signal. In this manner, the frequency-divider enable signal is controlled based on the predicted value in a period after the first statistical processing period. The period after the first statistical processing period is a time obtained by subtracting the delay time from an analysis result of the statistical processing. Time-series patterns of the predicted values 'A' to 'J' illustrated in FIG. 4 are merely examples, and are dynamically changed according to the operation states (busy state and non-busy state) of the blocks B0 to B3 in reality.

Figure 5:
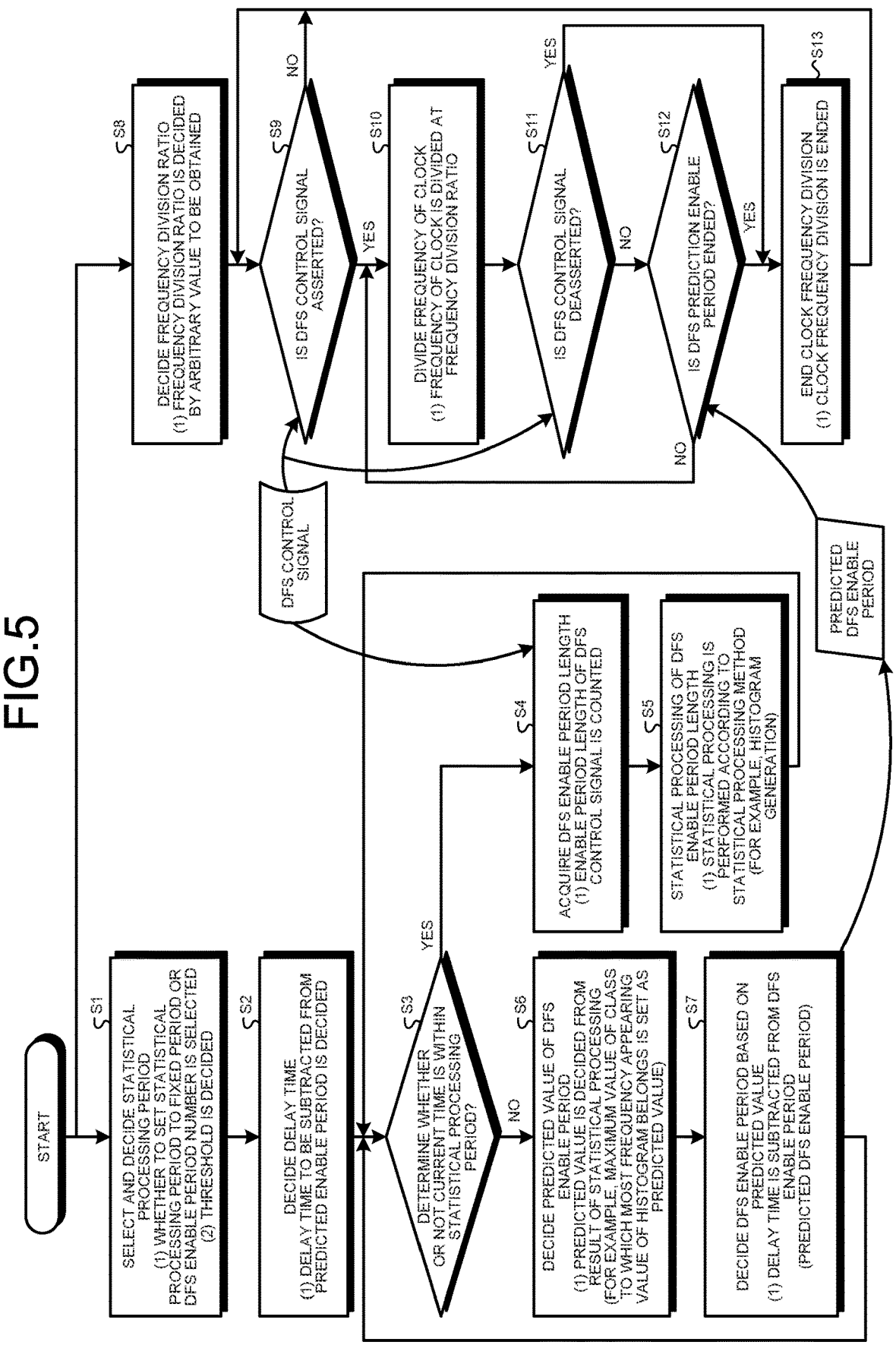
FIG. 5 is a flowchart illustrating the control method according to the first embodiment.

Next, the control method executed by the semiconductor integrated circuit 100 will be described with reference to FIG. 5. FIG. 5 is a flowchart illustrating the control method.

The clock controller 10 selects and decides the statistical processing period (S1). The clock controller 10 selects whether to set the statistical processing period to a fixed period or the DFS enable period number, and decides a threshold. Subsequently, the clock controller 10 decides the delay time to be subtracted from the predicted enable period (S2).

The clock controller 10 determines whether or not the current time is within the statistical processing period (S3). When the current time is within the statistical processing period (S3, Yes), the enable period length of the DFS control signal is counted, and the DFS enable period length (pulse time width) is acquired (S4). The clock controller 10 performs the statistical processing of the DFS enable period length (S5). For example, the histogram is created.

When the current time is not within the statistical processing period (S3, No), the clock controller 10 decides the predicted value of the DFS enable period from the result of the statistical processing (S6). For example, the maximum number of classes to which the most frequently appearing value of the histogram belongs is set as the predicted value. The clock controller 10 decides the DFS enable period based on the predicted value (S7). The clock controller 10 subtracts the delay time from the DFS enable period, and sets the subtraction result as the predicted DFS enable period. The clock controller 10 returns the processing to S3.

Meanwhile, the processing of S8 to S13 is performed in parallel with S1 to S7. The clock controller 10 decides the frequency division ratio by using an arbitrary value to be obtained (S8). The clock controller 10 waits until the DFS control signal is asserted (S9, No).

When the DFS control signal is asserted (S9, Yes), the clock controller 10 divides the clock according to the frequency division ratio (S10). When the DFS control signal is deasserted (S11, Yes), the clock controller 10 ends the frequency division of the clock (S13), and returns the processing to S9.

When the DFS control signal is not deasserted (S11, No), the clock controller 10 determines whether or not the DFS prediction valid period is ended. When the DFS prediction enable period is not ended (S12, No), the clock controller 10 returns the processing to S10. When the DFS prediction enable period is ended (S12, Yes), the frequency division of the clock is ended (S13), and the processing is returned to S9.

As described above, in the present embodiment, in the semiconductor integrated circuit 100, when the clock is changed from the high frequency to the low frequency, the time for which the low frequency is to be continued is statistically predicted, and the clock is returned to the high frequency after the predicted time elapses from the timing when the clock is changed to the low frequency. Accordingly, the performance deterioration can be suppressed.

Second Embodiment

Next, a control method according to a second embodiment will be described. Hereinafter, portions different from those of the first embodiment will be mainly described. In the second embodiment, the low frequency of the first embodiment is used as a reference frequency, and a frequency division ratio R is controlled such that the low frequency of the clock is a frequency (third frequency) adaptively decimated from the reference frequency (second frequency) according to the lengths of the DFS enable period (non-busy period) and the DFS disable period (busy period). That is, the semiconductor integrated circuit 100 uses the frequency division ratio $R_0$ of the first embodiment as the reference frequency division ratio, to adaptively adjust 1/(clock frequency division ratio m) corresponding to a frequency decimation rate from the low frequency, and supplies to the frequency divider 2 the frequency division ratio R (=$R_0$×m) obtained by multiplying the reference frequency division ratio $R_0$ by the clock frequency ratio m.

Specifically, the semiconductor integrated circuit 100 predicts the length of the current non-busy period and the length of the current busy period by the statistical processing of the past busy period and the past non-busy period, and obtains the predicted non-busy period and the predicted busy period. When the predicted non-busy period is long, the semiconductor integrated circuit 100 suppresses the performance deterioration by decreasing the frequency division ratio R as the predicted busy period becomes shorter. When the predicted non-busy period is short, the semiconductor integrated circuit 100 suppresses the performance deterioration by further decreasing the frequency division ratio R including a case where 1/m=1/1 as the busy period becomes shorter. Thus, each case has a relationship table between a level of the busy period and 1/(clock frequency division ratio m), and the table is switched based on the result of comparing the predicted non-busy period with the threshold. An allocation range of 1/(clock frequency division ratio m) of each table is changed, and thus, a frequency reduction width is decreased in a case where the predicted non-busy period is long, and the frequency reduction width is increased in a case where the predicted non-busy period is short. Accordingly, the low power consumption can be maintained, and the performance deterioration can be suppressed by deciding 1/(clock frequency division ratio m) in consideration of length level of the busy period. That is, in the semiconductor integrated circuit 100, there is a high possibility that it is possible to reduce the power consumption and maintain the performance by dividing the clock by the frequency division ratio R obtained by adaptively adjusting 1/(clock frequency division ratio m) according to the distribution state of the busy period and the non-busy period.

Figure 6:
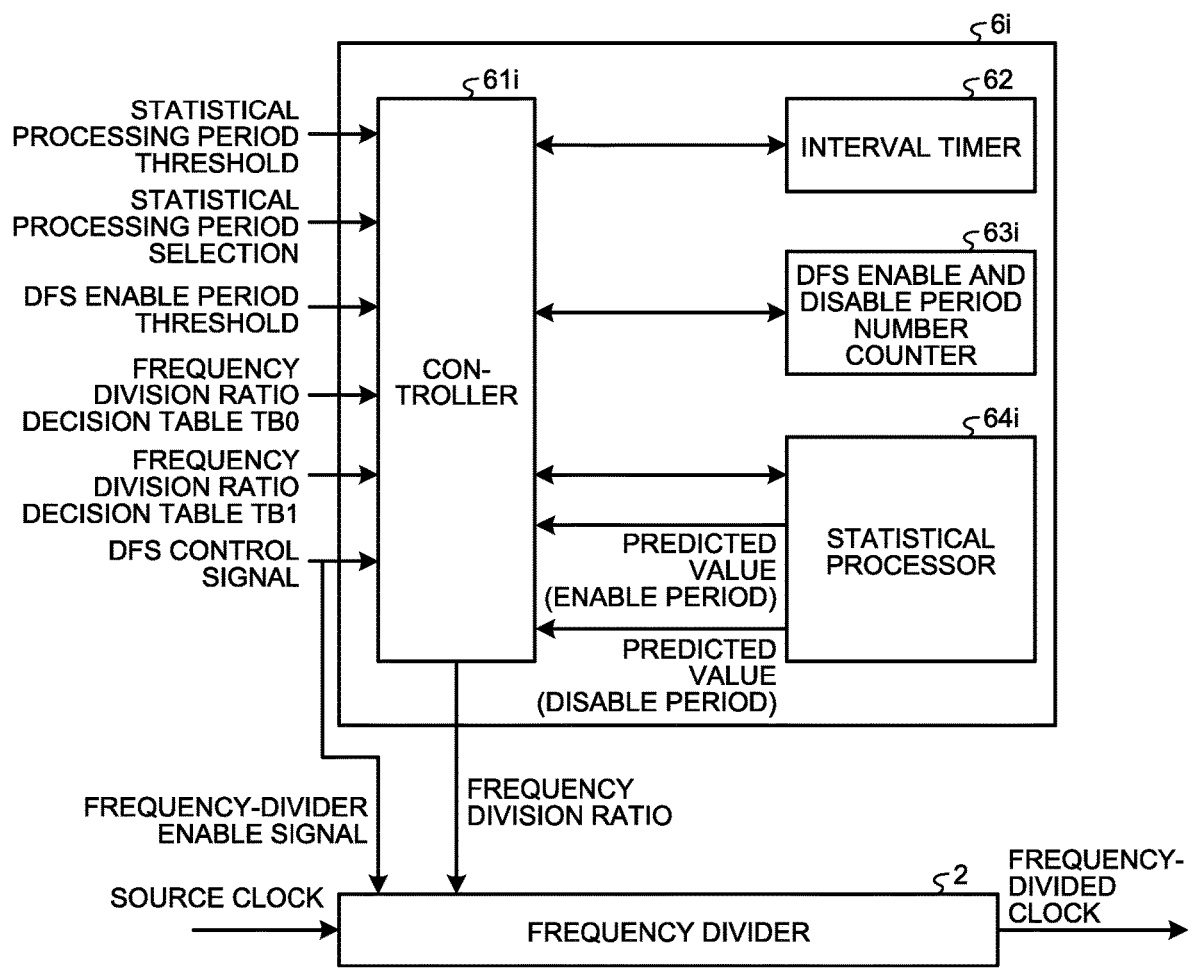
FIG. 6 is a configuration diagram of a clock controller according to a second embodiment.
Figure 8A:
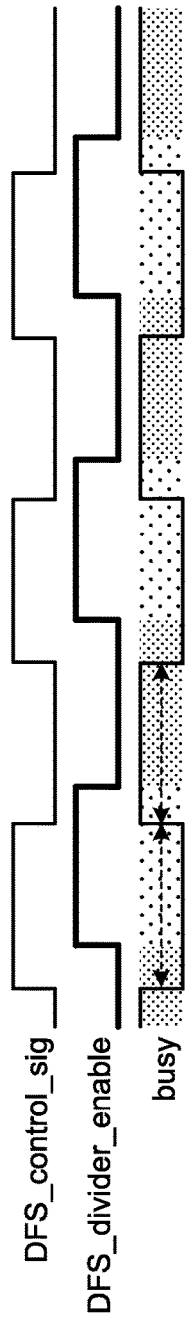
FIGS. 8A to 8D are timing charts illustrating a control method according to the second embodiment.
Figure 8B:
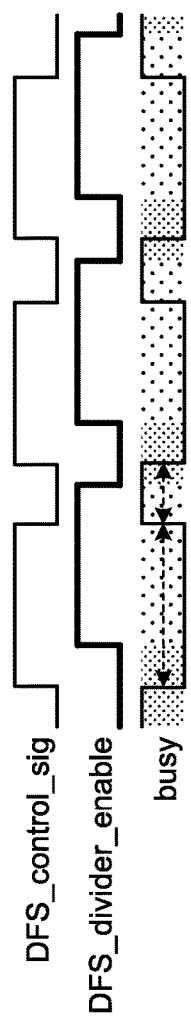
Figure 8C:
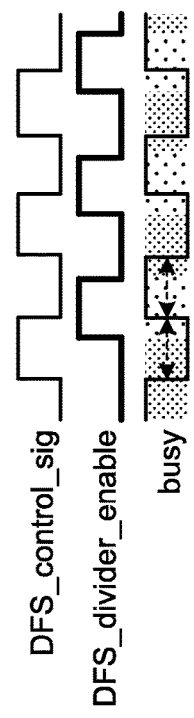
Figure 8D:
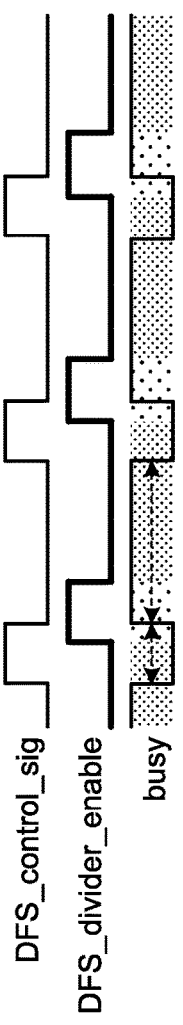

FIG. 6 is a configuration diagram of a clock controller according to the second embodiment. The clock controller 10i includes a controller 6i instead of the controller 6 according to the first embodiment. The controller 6i includes a controller 61i, an interval timer 62, a DFS enable and disable period number counter 63i, and a statistical processor 64i.

The counter 63i counts the number of DFS enable periods and the number of DFS disable periods, and supplies each counted value to the controller 61i. The controller 61i receives statistical processing period selection, a statistical processing period threshold, a DFS enable period threshold, a frequency division ratio decision table TB0, and a frequency division ratio decision table TB1 from the register 5, receives the DFS control signal from each of the blocks B0 to B3, and receives the predicted value of the non-busy period and the predicted value of the busy period from the statistical processor 64i. In response to these operations, the controller 61i adaptively adjusts 1/(clock frequency division ratio m), generates the frequency division ratio R by multiplying the reference frequency division ratio $R_0$ by the clock frequency division ratio m, and supplies the frequency division ratio R to the frequency divider 2. Accordingly, the controller 6i controls the frequency division processing using the frequency divider 2. The DFS control signal from each of the blocks B0 to B3 is used as the frequency divider enable signal to be supplied to the frequency divider 2, and is asserted in the non-busy period.

The controller 61i causes the statistical processor 64i to perform the statistical processing in the selected period. The statistical processor 64i generates the predicted values of the non-busy period and the busy period after the processing, and supplies the generated predicted values the controller 61i. The generation of the frequency division ratio in the controller 61i is performed by using the frequency division ratio decision table TB0 or TB1 selected according to the predicted value of the non-busy period and frequency division ratio decision information at the predicted value of the busy period. The frequency division ratio decision information is information in which the level of the predicted value of the busy period is associated with 1/(clock frequency division ratio m).

FIGS. 7A and 7B are diagrams illustrating examples of a data structure of the frequency division ratio decision information. The frequency division ratio decision table TB0 illustrated in FIG. 7A is a table used in a case where the predicted value of the non-busy period is larger than the DFS enable period threshold. The frequency division ratio decision table TB1 illustrated in FIG. 7B is a table used in a case where the predicted value of the non-busy period is smaller than the DFS enable period threshold. The allocation of the clock frequency division ratio m in each of the tables TB0 and TB1 is performed for each level obtained by dividing a range of the predicted value of the busy period into levels. The level can be decided such that the level becomes larger as the length of the predicted value of the busy period becomes longer. The clock frequency division ratio m becomes smaller as the level of the busy period becomes smaller including the case of 1/m=1/1. The range of the clock frequency division ratio m allocated to the frequency division ratio decision tables TB0 is larger than the range allocated to TB1.

Next, the control method according to the second embodiment will be described with reference to FIGS. 8A to 8D and FIG. 9. FIGS. 8A to 8D and FIG. 9 are timing charts illustrating the control method.

In FIGS. 8A to 8D, DFS_control_sig is the DFS control signal from each block, DFS_control_sig_delay is the delayed DFS control signal, and DFS_divider_enable (=DFS_control_sig_delay) is the frequency-divider enable signal. In FIG. 9, Inv_DFS_control_sig_delay is an inverted signal of DFS_control_sig_delay (delayed DFS inverted control signal).

In the timing chart illustrated in FIG. 9, in the first statistical processing period, 1/(clock frequency division ratio m) is 1/1 as an initial setting value. In the next statistical processing period, the predicted non-busy period is smaller than the DFS enable period threshold, the frequency division ratio decision table TB1 is selected, the predicted busy period is level 0, and 1/(clock frequency division ratio m) is decided as 1/1.

This processing is repeated for each statistical processing period, but the decision of 1/(clock frequency division ratio m) using the result in the previous statistical processing period may not be appropriate at a change point at which the tendency of the lengths of the busy period and the non-busy period is changed. It is possible to reduce the influence by adjusting the statistical processing period.

FIGS. 8A to 8D illustrate busy states by different kinds of combinations of the lengths of the non-busy period and the busy period. In FIGS. 8A to 8D, the clock is changed from the high frequency to the low frequency at the rising edge of the frequency-divider enable signal, and the clock is changed from the low frequency to the high frequency at the falling edge. That is, a period of the low level of the frequency-division enable signal indicates an operation period at the high frequency, and a period of the high level indicates an operation period at the low frequency.

In a case where the non-busy period is long and the busy period is long (FIG. 8A), since the performance deterioration due to the delay seems to be small, even though the clock frequency division ratio m is increased and the frequency division ratio R is increased, it is possible to maintain the performance and reduce the power consumption. In a case where the non-busy period is long and the busy period is short (FIG. 8B), since the performance deterioration due to the delay seems to be large, when the clock frequency division ratio m is increased and the frequency division ratio R is increased, the performance deterioration may become remarkable. However, since the non-busy period is long, the effect of reducing the power consumption is increased. In a case where the non-busy period is short and the busy period is short (FIG. 8C), the performance deterioration due to the delay seems to be large. When the clock frequency division ratio m is increased and the frequency division ratio R is increased, the performance deterioration may become remarkable. Since the non-busy period is short, the effect of reducing the power consumption is small. In a case where the non-busy period is short and the busy period is long (FIG. 8D), the performance deterioration due to the delay seems to be small. Even though the clock frequency division ratio m is increased and the frequency division ratio R is increased, the performance is maintained, but the effect of reducing the power consumption is small.

An appropriate 1/(clock frequency division ratio m) is decided by using the non-busy period and the busy period predicted in consideration of such busy states, and thus, there is a high possibility that it is possible to maintain the performance and reduce the power consumption. Since the tables TB0 and TB1 can be freely defined, flexible DFS control such as emphasis of the performance and emphasis of the low power consumption may also be performed depending on the characteristics of the system and each block.

Figure 10:
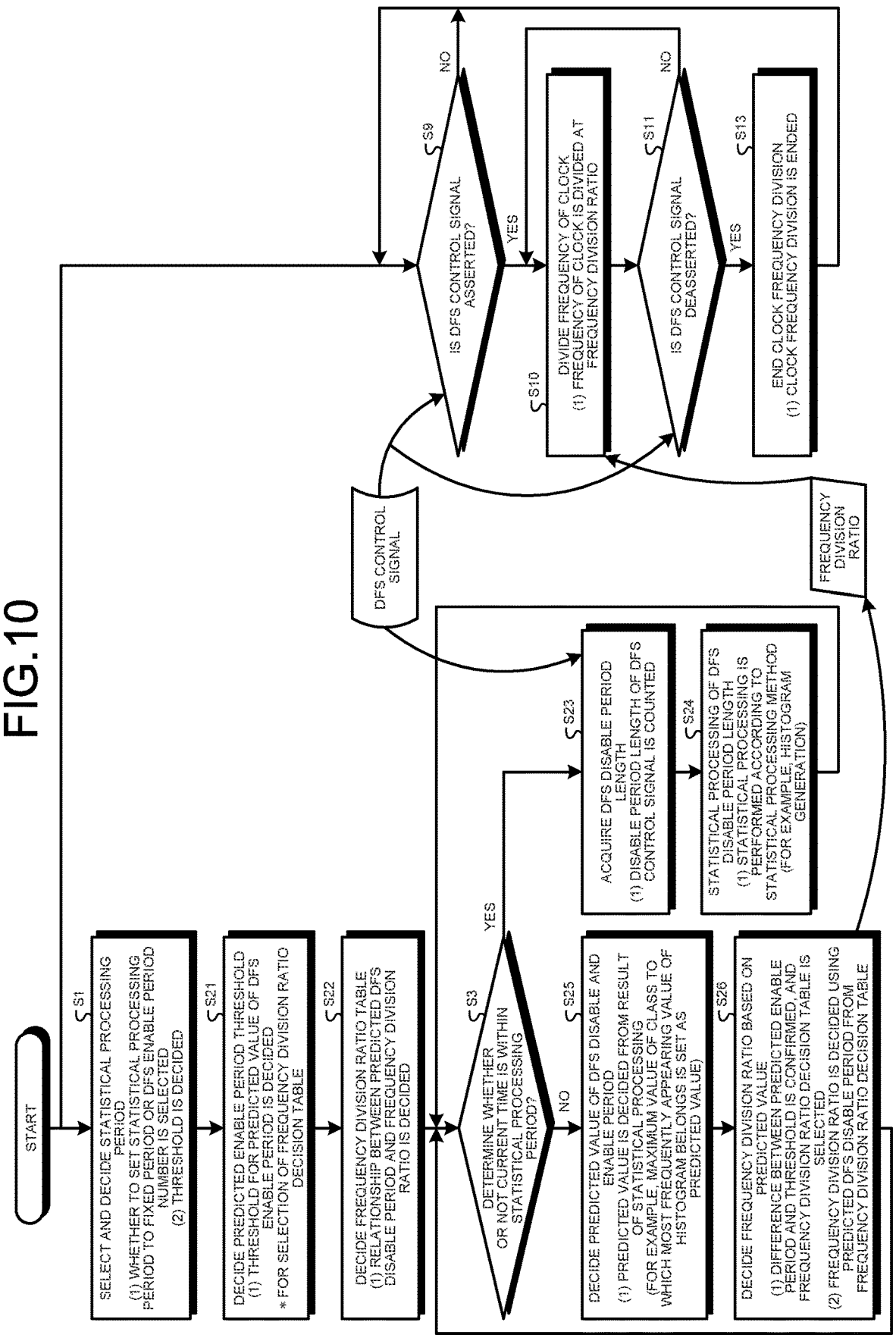
FIG. 10 is a flowchart illustrating the control method according to the second embodiment.

FIG. 10 is a flowchart illustrating the control method according to the second embodiment. After S1, the clock controller 10i decides a threshold for the predicted value of the DFS enable period in order to select the frequency division ratio decision table (S21). The clock controller 10i decides the frequency division ratio table (S22).

The clock controller 10i determines whether or not the current time is within the statistical processing period (S3). When the current time is within the statistical processing period (S3, Yes), the disable period length of the DFS control signal is counted, and the DFS disable period length (pulse time width) is acquired (S23). The clock controller 10i performs the statistical processing of the DFS disable period length (S24). For example, the histogram is created.

When the current time is not within the statistical processing period (S3, No), the clock controller 10i decides the predicted values of the DFS able and disable periods from the result of the statistical processing (S25). For example, the maximum value of the class to which the most frequently appearing value of the histogram belongs is set as the predicted value. The clock controller 10i decides the clock frequency division ratio m based on the predicted value (S26). The clock controller 10i confirms a difference between the predicted enable period and the threshold, and selects the frequency division ratio decision table. The clock controller 10i selects the frequency division ratio decision table TB0 when the predicted enable period is larger than the threshold, and selects the frequency division ratio decision table TB1 when the predicted enable period is larger than the threshold. The clock controller 10i decides 1/(clock frequency division ratio m) from the selected frequency division ratio decision table, and obtains the frequency division ratio R by multiplying the reference frequency division ratio $R_0$ by the clock frequency division ratio m. The clock controller 10i returns the processing to S3.

Meanwhile, the processing of S9 to S13 is performed in parallel with S1 to S26. That is, in the second embodiment, S8 and S12 are omitted from the processing of S8 to S13 illustrated in FIG. 5.

As described above, in the present embodiment, the semiconductor integrated circuit 100 controls the frequency division ratio R such that the low frequency of the clock is the frequency (third frequency) adaptively decimated from the reference frequency (second frequency) according to the lengths of the DFS enable period and the DFS disable period. That is, the semiconductor integrated circuit 100 adaptively adjusts 1/(clock frequency division ratio m) corresponding to the frequency decimation rate of the frequency from the reference frequency, generates the frequency division ratio R ($=R_0 \times m$) by multiplying the reference division ratio $R_0$ by the clock frequency division ratio m, and frequency-divides the source clock at the frequency division ratio R. Accordingly, it is possible to suppress the performance deterioration while maintaining the effect of reducing the power consumption.

Third Embodiment

Figure 11:
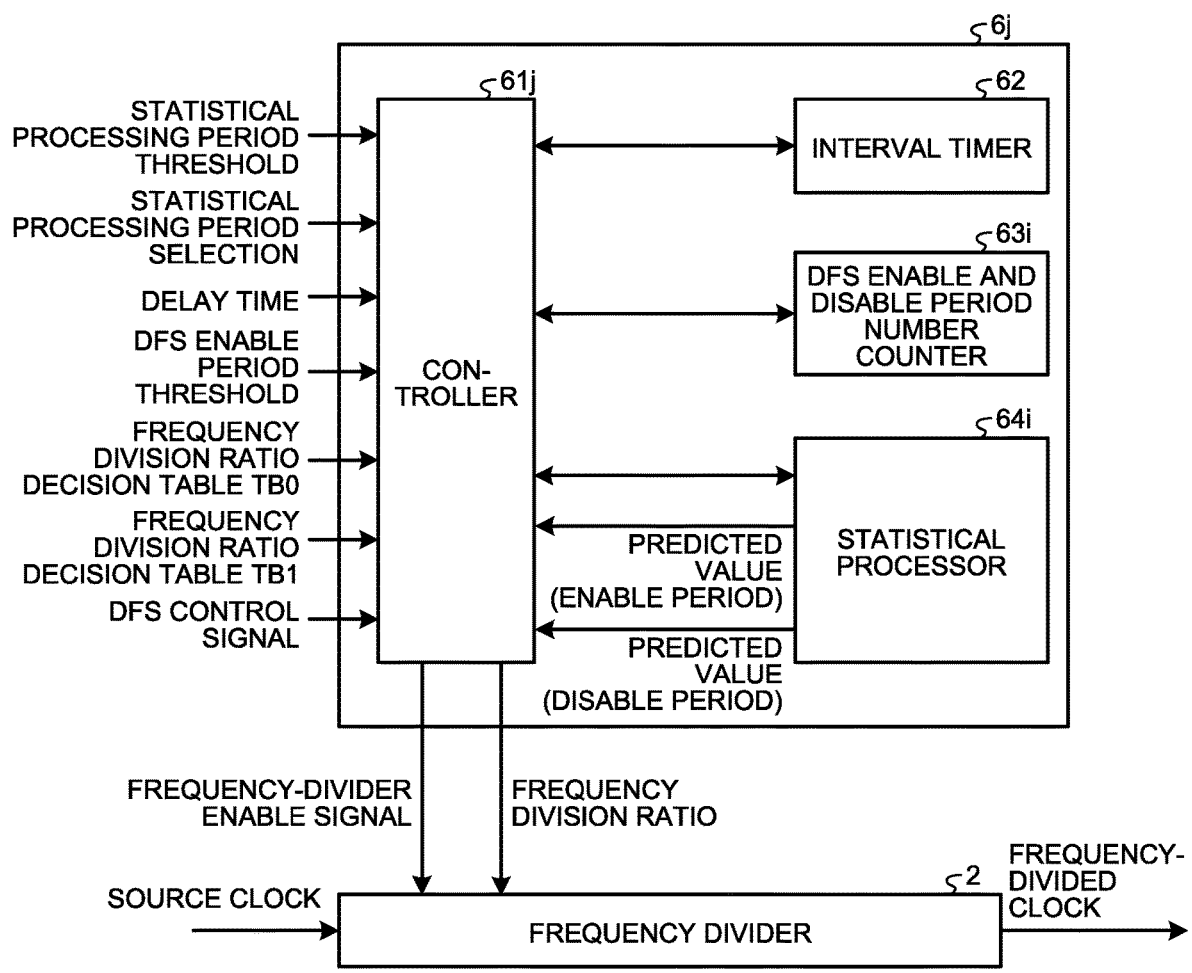
FIG. 11 is a configuration diagram of a clock controller according to a third embodiment.

Next, a control method according to a third embodiment will be described. Hereinafter, portions different from those of the first and second embodiments will be mainly described. In the third embodiment, the control methods of the first and second embodiments are combined. FIG. 11 is a configuration diagram of a clock controller according to the third embodiment. The clock controller 10j includes a controller 6j instead of the controller 6i according to the second embodiment. The controller 6j includes a controller 61j instead of the controller 61i according to the second embodiment.

The controller 61j receives the statistical processing period selection, the statistical processing period threshold, the delay amount, the DFS enable period threshold, the frequency division ratio decision table TB0, and the frequency division ratio decision table TB1 from the register 5, receives the DFS control signal from each of the blocks B0 to B3, and receives the predicted value of the non-busy period and the predicted value of the busy period from the statistical processor 64i. In response to these operations, the controller 61j generates the frequency division ratio R and the frequency-divider enable signal, and supplies the generated frequency division ratio and frequency-divider enable signal to the frequency divider 2. Accordingly, the controller 6j controls the frequency division processing using the frequency divider 2. In the present configuration, since the statistical processing period is the same between the generation of the frequency division ratio R and the generation of the frequency-divider enable signal, the degree of freedom of adjustment can be restricted.

Figure 12:
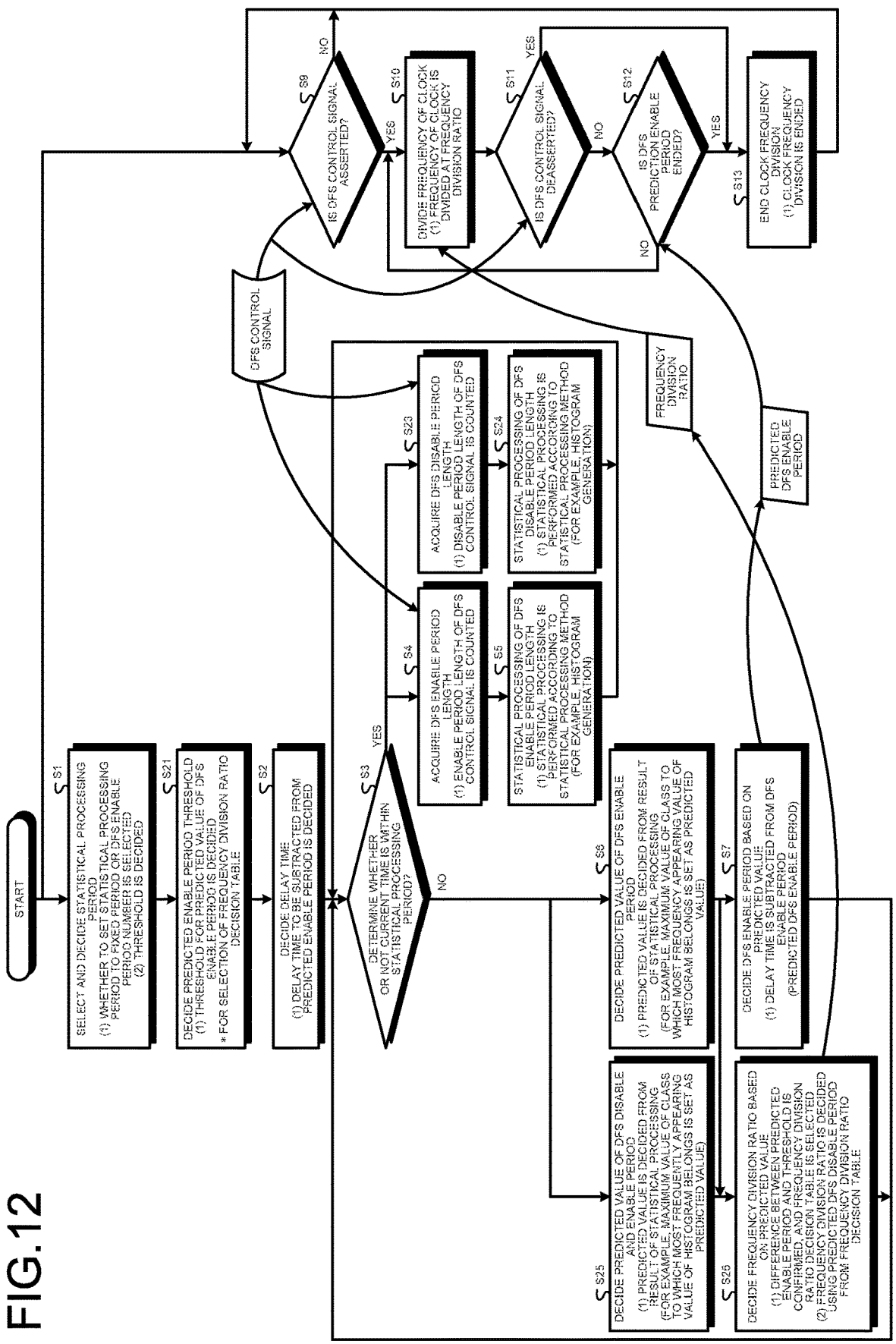
FIG. 12 is a flowchart illustrating a control method according to the third embodiment.

FIG. 12 is a flowchart illustrating the control method according to the third embodiment. The clock controller 10j performs S1, S21, and S3 in order. When the current is within the statistical processing period (S3, Yes), the clock controller 10j performs the processing of S4 and S5 and the processing of S23 and S24 in parallel, and returns the processing to S3. When the current time is not within the statistical processing period (S3, No), the clock controller 10j performs the processing of S6 and S7 and the processing of S25 and S26 in parallel, and returns the processing to S3.

Meanwhile, the processing of S9 to S13 is performed in parallel with S1 to S26. That is, in the third embodiment, S8 is omitted from the processing of S8 to S13 illustrated in FIG. 5.

As described above, in the present embodiment, the semiconductor integrated circuit 100 statistically predicts the time for which the low frequency is to be continued when the clock is changed from the high frequency to the low frequency, and returns the clock to the high frequency after the predicted time elapses. The semiconductor integrated circuit 100 generates the frequency division ratio R ($=R_0 \times m$) while adaptively adjusting 1/(clock frequency division ratio m) according to the lengths of the DFS enable period (non-busy period) and the DFS disable period (busy period), and frequency-divides the source clock at the frequency division ratio R. Accordingly, it is possible to suppress the performance deterioration while maintaining the effect of reducing the power consumption.

Fourth Embodiment

Next, a control method according to a fourth embodiment will be described. Hereinafter, portions different from those of the first to third embodiments will be mainly described. In the fourth embodiment, the control methods of the first and second embodiments are combined, and a controller that generates the frequency-divider enable signal and a controller that generates the frequency division ratio R are separated.

Figure 13:
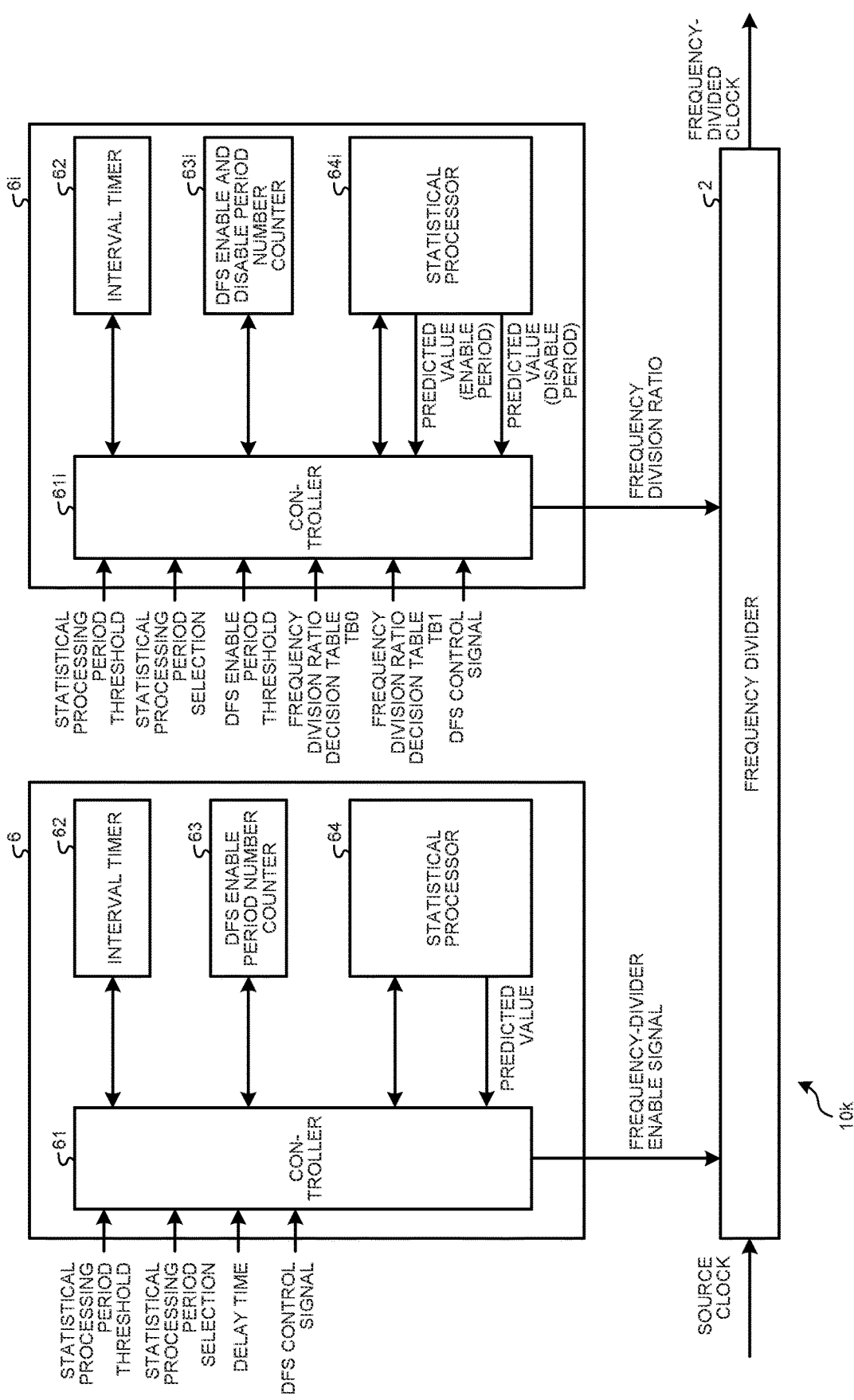
FIG. 13 is a configuration diagram of a clock controller according to a fourth embodiment.

FIG. 13 is a configuration diagram of a clock controller according to the fourth embodiment. The clock controller 10k includes a controller 6i according to the second embodiment in addition to the controller 6 according to the first embodiment.

The controller 61 generates the frequency-divider enable according to the statistical processing period threshold, the statistical processing period selection, the delay time, the DFS control signal, and the predicted value of the non-busy period, and supplies the generated frequency-divider enable signal to the frequency divider 2. The controller 61i generates the frequency division ratio R according to the statistical processing period selection, the statistical processing period threshold, the DFS enable period threshold, the frequency division ratio decision table TB0, the frequency division ratio decision table TB1, the DFS control signal, the predicted value of the non-busy period, and the predicted value of the busy period, and supplies the generated frequency division ratio R to the frequency divider 2. Accordingly, the controller according to the fourth embodiment controls the frequency division processing using the frequency divider 2.

In the present embodiment, since the statistical processing period can be different between the generation of the frequency division ratio and the generation of the frequency-divider enable signal, the degree of freedom of adjustment can be improved.

As described above, in the fourth embodiment, in the semiconductor integrated circuit 100k, the controller 6 that generates the frequency-divider enable and the controller 6i that generates the frequency division ratio R are separated. Accordingly, since the frequency-divider enable processing and the frequency division ratio generation processing are independent, the statistical processing period can be separately set. As a result, the degree of freedom of adjustment can be improved, and the frequency of the clock can be more appropriately adjusted in the fourth embodiment than in the third embodiment.

It should be noted that, although it has been described in the embodiment that one clock controller 10 supplies the clocks to the plurality of blocks, the semiconductor integrated circuit 100 may include a plurality of clock controllers 10 (a plurality of DFS control architectures). The plurality of clock controllers may be provided so as to correspond to the plurality of blocks. At this time, the frequencies of the clocks to be supplied from the clock controllers 10 to the corresponding blocks may be different from each other. Alternatively, the semiconductor integrated circuit 100 may have a configuration in which the plurality of frequency dividers 2 and 3 is provided so as to correspond to the plurality of blocks B0 to B3 within the clock controller 10. At this time, the frequencies of the clocks to be supplied from the frequency dividers 2 and 3 to the corresponding blocks may be different from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a clock controller that generates a clock; and
a plurality of blocks that operate by using the clock,
wherein the clock controller performs a statistical processing for the plurality of blocks, controls a frequency of the clock to a first frequency, changes the frequency of the clock from the first frequency to a second frequency, generates the clock the frequency of which is changed from the second frequency to the first frequency after a time predicted by the statistical processing as a time for which the second frequency is to be continued elapses from a timing when the frequency of the clock is changed to the second frequency, and supplies the generated clock to the plurality of blocks, and
wherein the clock controller generates the clock the frequency of which is changed to a third frequency obtained by decimating down the second frequency from the first frequency according to a time for which the first frequency is to be continued and the time for which the second frequency is to be continued after the frequency of the clock is changed from the second frequency to the first frequency, and supplies the generated clock to the plurality of blocks.

2. The semiconductor integrated circuit according to claim 1, wherein the time for which the second frequency is to be continued includes a non-busy period in which a circuit block to which the clock is supplied is waiting.

3. The semiconductor integrated circuit according to claim 1, wherein:
the time for which the first frequency is to be continued includes a busy period in which a circuit block to which the clock is supplied is operating, and
the time for which the second frequency is to be continued includes a non-busy period in which the circuit block to which the clock is supplied is waiting.

4. A semiconductor integrated circuit comprising:
a register configured to store a statistical processing period threshold, a statistical processing period selection signal, and a delay time;
a controller configured to receive the statistical processing period threshold, the statistical processing period selection signal, and the delay time from the register and to generate a frequency-divider enable signal in response to the statistical processing period threshold, the statistical processing period selection signal, and the delay time; and
a frequency divider configured to receive the generated frequency-divider enable signal, to frequency-divide a source clock in a period in which the frequency divider enable signal is at an active level, and not to frequency-divide the source clock in a period in which the frequency-divider enable signal is at a non-active level.

* * * * *